United States Patent
Agari et al.

(10) Patent No.: US 7,894,292 B2
(45) Date of Patent: Feb. 22, 2011

(54) SEMICONDUCTOR DEVICE FOR PREVENTING ERRONEOUS WRITE TO MEMORY CELL IN SWITCHING OPERATIONAL MODE BETWEEN NORMAL MODE AND STANDBY MODE

(75) Inventors: Takeshi Agari, Tokyo (JP); Hirotoshi Sato, Tokyo (JP); Kiyoyasu Akai, Tokyo (JP); Minoru Senda, Tokyo (JP); Hiroaki Nakai, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 202 days.

(21) Appl. No.: 12/360,521

(22) Filed: Jan. 27, 2009

(65) Prior Publication Data

US 2009/0196115 A1     Aug. 6, 2009

(30) Foreign Application Priority Data

Feb. 5, 2008    (JP) .............................. 2008-025173

(51) Int. Cl.
*G11C 5/14*     (2006.01)
(52) U.S. Cl. ...................... 365/229; 365/226
(58) Field of Classification Search ................. 365/229, 365/227, 230.06
See application file for complete search history.

(56) References Cited

U.S. PATENT DOCUMENTS

| 5,901,103 | A | * | 5/1999 | Harris et al. | ................. 365/226 |
| 5,969,995 | A | | 10/1999 | Morishima | |
| 6,333,874 | B2 | * | 12/2001 | Yamauchi | ............... 365/189.09 |
| 6,414,894 | B2 | * | 7/2002 | Ooishi et al. | ................. 365/222 |

FOREIGN PATENT DOCUMENTS

| JP | 07-244982 | 9/1995 |
| JP | 07-254274 | 10/1995 |
| JP | 11-219589 | 8/1999 |
| JP | 2006-252718 | 9/2006 |

* cited by examiner

*Primary Examiner*—Anh Phung
(74) *Attorney, Agent, or Firm*—McDermott Will & Emery LLP (57) ABSTRACT

When an operational mode is shifted to a standby mode, a first transistor is brought into a conduction state by a control signal, and a word line is thereby clamped to a ground voltage. Further, a second transistor is brought into a non-conduction state, and supply of an internal power supply voltage to a word line driver is shut off. Subsequently, the supply of the internal power supply voltage is halted for saving electrical power. When the operational mode returns to a normal mode, the supply of the internal power supply voltage is started, and subsequently, the first transistor is brought into the non-conduction state by the control signal, and the second transistor is thereby brought into the conduction state.

10 Claims, 9 Drawing Sheets

SEMICONDUCTOR DEVICE FOR PREVENTING ERRONEOUS WRITE TO MEMORY CELL IN SWITCHING OPERATIONAL MODE BETWEEN NORMAL MODE AND STANDBY MODE

BACKGROUND OF THE INVENTION

1. Field of the Invention

The present invention relates to a semiconductor device, and particularly relates to a semiconductor device including a static-type semiconductor memory.

2. Description of the Background Art

In a low-power-consumption semiconductor device, a standby mode (sleep mode) in which power supply is shut off may be provided. In the standby mode, a power voltage is supplied only to some circuits necessary for holding data, such as a memory cell of an SRAM (Static Random Access Memory).

In the SRAM described in Japanese Patent Laying-Open No. 11-219589, for example, supply of a power supply voltage to the circuits other than a memory cell and a word line potential clamping circuit is shut off during a sleep period in which data is held. The word line potential clamping circuit clamps the word line to a non-selection level during the sleep period, so as to prevent instability in word line potential and the resultant data corruption in the memory cell.

Japanese Patent Laying-Open No. 2006-252718 discloses a semiconductor storage device that can operate with much lower power consumption in a standby mode. In the semiconductor storage device, an output node of each word line driver is brought into a high impedance state so as not to allow a gate leak current to flow through each word line driver in the standby mode. Further, each word line is provided with a half latch circuit for clamping the word line to a non-activated level.

Japanese Patent Laying-Open No. 07-244982 discloses a technique for deterring a current that transiently flows to a word line, when a semiconductor memory device is brought into an inactive state (i.e. in a standby mode). In the conventional technique, there is provided setting means for setting an output of a multi-input logic gate (row decoder) to a logic level at which a signal indicating a non-selection state is outputted to a word line. Further, there is provided shut-off means for shutting off a flow-through current that flows from a power supply potential to a ground potential in the multi-input logic gate.

The conventional technique described in Japanese Patent Laying-Open No. 07-254274 is for providing a word line noise killer circuit array between a memory cell array and a word line drive circuit array. The word line noise killer circuit suppresses variations in potential level of an output node of a row decoder.

When an operational mode of the semiconductor device is shifted from a normal mode to a standby mode, or returns to the normal mode from the standby mode, a noise may be generated in association with a falling edge or a rising edge of the power supply voltage. When the generated noise flows from the word line driver to the word line, an access transistor of the memory cell may be brought into conduction to cause erroneous write to the memory cell. The conventional techniques described above cannot sufficiently prevent the erroneous write to the memory cell, caused by such a noise.

SUMMARY OF THE INVENTION

An object of the present invention is to prevent, in a semiconductor device having a normal mode and a standby mode as an operational mode, erroneous write to a memory cell in switching the operational mode.

To summarize, the present invention is a semiconductor device including a normal mode and a standby mode as an operational mode, the semiconductor device including: a power supply unit; a memory cell array; a plurality of word line drivers; a plurality of first switches; a second switch; and a control circuit. Here, the power supply unit generates a first internal power supply voltage and a second internal power supply voltage. The memory cell array includes a plurality of memory cells provided in rows and columns and driven by the first internal power supply voltage, and a plurality of word lines provided to correspond to the rows of the plurality of memory cells, respectively. The plurality of word line drivers are provided to correspond to the plurality of word lines, respectively, and each is driven by the second internal power supply voltage for bringing a corresponding one of the word lines into an active state. The plurality of first switches are provided to correspond to the plurality of word lines, respectively, and each is connected between a corresponding one of the word lines and a reference node providing a reference voltage. The second switch is provided at a power supply line serving for supplying the second internal power supply voltage to the plurality of word line drivers. When the operational mode is switched from the normal mode to the standby mode, the control circuit brings the plurality of first switches into a conduction state and brings the second switch into a non-conduction state, and subsequently halts supply of the second internal power supply voltage. Further, when the operational mode is switched from the standby mode to the normal mode, the control circuit starts the supply of the second internal power supply voltage, and subsequently brings the plurality of first switches into the non-conduction state and brings the second switch into the conduction state.

According to the present invention, before the supply of the second power supply voltage is halted, a voltage of each of the plurality of word lines is preliminarily clamped to the reference voltage, and thereby the power supply line of the word line drivers is interrupted. Further, after the supply of the second power supply voltage is started, voltage clamp of the word line drivers is cancelled, and the power supply line of the word line drivers is connected. Therefore, the major advantage of the present invention is to be able to prevent erroneous write to the memory cell by preventing a noise, which is generated by switching between the normal mode and the standby mode, from flowing to the word lines.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will hereinafter be described in detail with reference to the drawings. It is noted that the same or corresponding portions are provided with the same reference characters, and the description thereof will not be repeated.

First Embodiment

Figure 1:
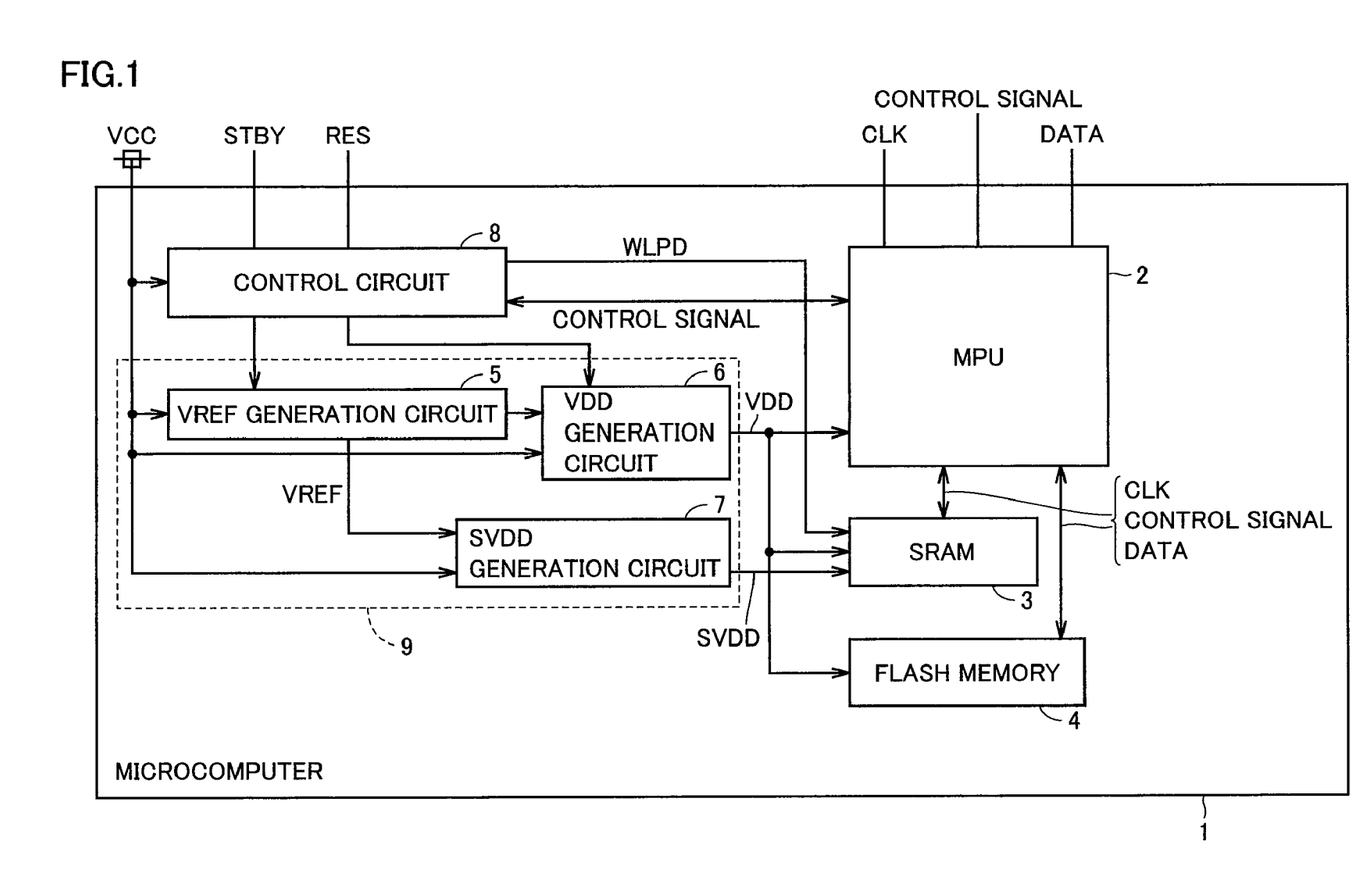
FIG. 1 is a block diagram that shows a configuration of a semiconductor device 1 in a first embodiment of the present invention.

FIG. 1 is a block diagram that shows a configuration of a semiconductor device 1 in a first embodiment of the present invention. FIG. 1 shows a microcomputer as an example of semiconductor device 1.

With reference to FIG. 1, semiconductor device 1 includes a microprocessor unit (MPU) 2, an SRAM 3, a flash memory 4, a VREF generation circuit 5, a VDD generation circuit 6, an SVDD generation circuit 7, and a control circuit 8. VREF generation circuit 5, VDD generation circuit 6, and SVDD generation circuit 7 configure a power supply unit 9.

Semiconductor device 1 switches an operational mode between a normal mode and a standby mode in accordance with a standby signal STBY and a reset signal RES which are supplied from an outside. In the standby mode in which both of standby signal STBY and reset signal RES are at an L level, power supply to the circuits other than some circuits necessary for holding data is halted to reduce power consumption.

Specifically, VREF generation circuit 5 is driven by an external power supply voltage VCC (e.g. 3 V) supplied from a battery, a switching power supply, or the like, and generates a reference voltage VREF (e.g. 1.5 V). VDD generation circuit 6 is driven by external power supply voltage VCC, and in the normal mode of semiconductor device 1, generates an internal power supply voltage VDD being at the same level as that of reference voltage VREF. In the standby mode of semiconductor device 1, VDD generation circuit 6 halts the supply of internal power supply voltage VDD (second internal power supply voltage) to reduce a standby current. SVDD generation circuit 7 is driven by external power supply voltage VCC, and generates an internal power supply voltage SVDD (first internal power supply voltage) being at the same level as that of reference voltage VREF. Supply of internal power supply voltage SVDD is maintained even in the standby mode.

Control circuit 8 is driven by external power supply voltage VCC, and controls start and halt of the supply of internal power supply voltage VDD generated at VDD generation circuit 6, in accordance with standby signal STBY and reset signal RES. Further, control circuit 8 outputs a control signal WLPD for controlling SRAM 3, in accordance with an operational mode. At this time, in the normal mode in which both of standby signal STBY and reset signal RES are at an H level, control signal WLPD at a non-activated level, namely, at an L level is outputted. In contrast, in the standby mode in which both of standby signal STBY and reset signal RES are at an L level, control signal WLPD at an activated level, namely, at an H level is outputted.

Microprocessor unit 2 is driven by internal power supply voltage VDD, and performs data processing in accordance with a clock signal CLK and a control signal supplied from an outside. Flash memory 4 is controlled by clock signal CLK and the control signal, and stores data. SRAM 3 is a volatile semiconductor storage device driven by internal power supply voltages VDD, SVDD, and is controlled by clock signal CLK, the control signal, control signal WLPD, and the like, to store data. In semiconductor device 1 in FIG. 1, supply of internal power supply voltage VDD to microprocessor unit 2, flash memory 4, and some circuits in SRAM 3 is halted in the standby mode.

Figure 2:
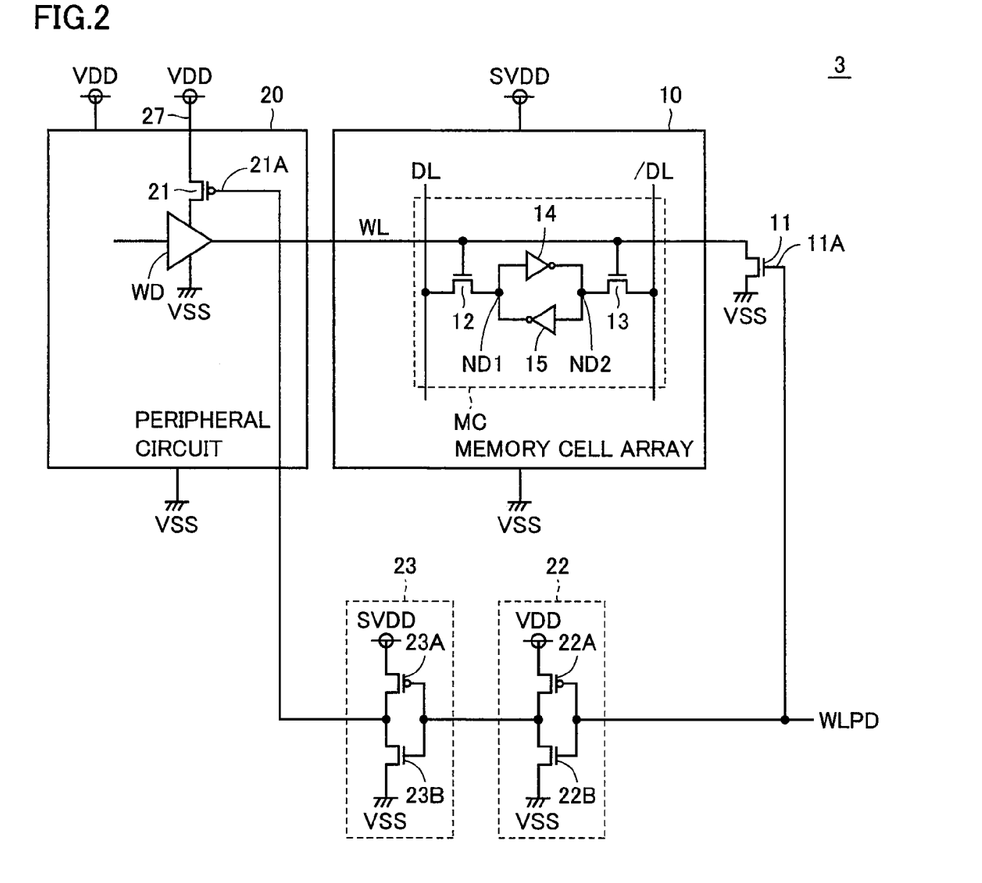
FIG. 2 is a block diagram for describing an operation of an SRAM 3 in a standby mode.

FIG. 2 is a block diagram for describing an operation of SRAM 3 in the standby mode.

With reference to FIG. 2, SRAM 3 includes a memory cell array 10 driven by internal power supply voltage SVDD, and a peripheral circuit 20 driven by internal power supply voltage VDD.

Memory cell array 10 includes a plurality of memory cells MC arranged in rows and columns, a plurality of word lines WL provided to correspond to the rows of the memory cells, respectively, and a plurality of data line pairs DL, /DL provided to correspond to the columns of the memory cells, respectively. FIG. 2 schematically shows one memory cell MC, and one word line WL and one pair of data lines DL, /DL connected thereto.

Memory cell MC in SRAM 3 includes two inverters 14, 15 connected between a storage node ND1 and a storage node ND2, an N-channel MOS (Metal Oxide Semiconductor) transistor (access transistor) 12 connected between storage node ND1 and data line DL, and an N-channel MOS transistor (access transistor) 13 connected between storage node ND2 and data line /DL.

Here, inverter 14 outputs a signal at storage node ND1 to storage node ND2, with its logic level inverted. Inverter 15 outputs a signal at storage node ND2 to storage node ND1, with its logic level inverted. Therefore, when a voltage at storage node ND1 is at an H level (internal power supply voltage SVDD), for example, a voltage at storage node ND2 becomes an L level (ground voltage VSS), and this state is maintained. In other words, inverters 14, 15 function as a latch circuit (flip-flop) that holds data at storage nodes ND1, ND2.

When the data held at storage nodes ND1, ND2 is to be rewritten, one of data lines DL, /DL is brought into an H level and the other of them is brought into an L level, in accordance with the data to be written. In this state, when word line WL is activated to an H level, access transistors 12, 13 are brought into a conduction state, so that voltages at storage nodes ND, ND2 are changed in accordance with voltages of data lines DL, /DL.

Peripheral circuit 20 in FIG. 2 has a decoder that selects a memory cell MC in accordance with an address signal, a circuit for performing data read and write operations at the selected memory cell MC, and others. Here, as shown in FIG. 2, peripheral circuit 20 includes word line drivers WD provided to correspond to word lines WL, respectively. Word line driver WD is driven by internal power supply voltage VDD, and activates word line WL corresponding to the selected memory cell MC to an H level.

SRAM 3 in FIG. 2 further includes an N-channel MOS transistor 11 (first switch) connected between each word line WL and ground node VSS, and a P-channel MOS transistor 21 (second switch) provided at a power supply line 27 serving for supplying internal power supply voltage VDD to word line driver WD. It is noted that a ground node (reference node) VSS provides a ground voltage (reference voltage) VSS.

In the standby mode of semiconductor device 1, when MOS transistor 11 receives, at its gate electrode 11A (control node), control signal WLPD at an H level outputted from control circuit 8 in FIG. 1, MOS transistor 11 is brought into a conduction state. As a result, a voltage of word line WL becomes ground voltage VSS. As such, MOS transistor 11 functions as a switch for clamping the word line to an L level (inactive level) in the standby mode. Consequently, variations in voltage of word line WL, which are caused by a noise and the like, are suppressed, and erroneous write to memory cell MC is prevented to a certain degree.

MOS transistor 21 serves as a switch for preliminarily shutting off internal power supply voltage VDD to be supplied to word line driver WD, when the operational mode is switched. In the standby mode, MOS transistor 11 described above sets word line WL to an inactive state. However, the size of MOS transistor 11 is much smaller than the size of the MOS transistor that configures word line driver WD. Therefore, when a noise is generated in association with a falling edge or rising edge of internal power supply voltage VDD in switching of the operational mode, the generated noise flows from word line driver WD to word line WL, and hence erroneous write to memory cell MC may occur.

Therefore, when the operational mode is shifted from the normal mode to the standby mode, control circuit 8 in the first embodiment brings MOS transistor 21 into a non-conduction state before halting the supply of internal power supply voltage VDD, to thereby preliminarily shut off the supply of internal power supply voltage VDD to word line driver WD. Further, when the operational mode returns to the normal mode from the standby mode, control circuit 8 brings MOS transistor 21 into a conduction state after starting the supply of internal power supply voltage VDD, to thereby connect word line driver WD to the power supply line for internal power supply voltage VDD.

SRAM 3 in FIG. 2 further includes an inverter 22 (first inverter) driven by internal power supply voltage VDD, and an inverter 23 (second inverter) driven by internal power supply voltage SVDD, as a driver for driving a gate electrode 21A of MOS transistor 21.

Inverter 22 receives control signal WLPD outputted from control circuit 8 in FIG. 1, and outputs the received signal to inverter 23 with its logic level inverted. Inverter 23 receives an output of inverter 22, and outputs the received signal to gate electrode 21A (control node) of MOS transistor 21 with its logic level further inverted (i.e. outputs the signal having a logic level equal to the logic level of control signal WLPD).

As shown in FIG. 2, each of inverters 22, 23 is configured with a CMOS (Complementary Metal Oxide Semiconductor) inverter. Specifically, inverter 22 includes a P-channel MOS transistor 22A and an N-channel MOS transistor 22B connected in series between a power supply node VDD (node to which internal power supply voltage VDD is supplied) and ground node VSS. Inverter 23 includes a P-channel MOS transistor 23A and an N-channel MOS transistor 23B connected in series between a power supply node SVDD (node to which internal power supply voltage SVDD is supplied) and ground node VSS. Here, control signal WLPD is inputted to gate electrodes of MOS transistors 22A, 22B (i.e. an input node of inverter 22). A connection node of MOS transistors 22A, 22B (i.e. an output node of inverter 22) and gate electrodes of MOS transistors 23A, 23B (i.e. an input node of inverter 23) are connected. A connection node of MOS transistors 23A, 23B (i.e. an output node of inverter 23) is connected to gate electrode 21A (control node) of MOS transistor 21.

It is noted that each of inverters 22, 23 is not necessarily configured with a CMOS inverter. For example, a resistor may also be used instead of MOS transistors 22A, 23A each serving as a load transistor.

In the standby mode, when control signal WLPD becomes an H level, MOS transistors 22B, 23A are brought into a conduction state. In this case, even if the supply of internal power supply voltage VDD with which inverter 22 is driven is halted, the conduction state of MOS transistors 22B, 23A is maintained, and hence an output voltage of inverter 23 is also kept in an H level (internal power supply voltage SVDD) state. Therefore, although the supply of internal power supply voltage VDD is halted, MOS transistor 21 can be kept in a non-conduction state during the standby mode.

The reason for providing inverters 22, 23 is as follows.

The first reason is to ensure a current required for driving gate electrode 21A of MOS transistor 21. If the circuit size of SRAM 3 is increased, an amount of a current required for operating the plurality of word line drivers WD is increased. Accordingly, it is necessary to increase the gate width of MOS transistor 21, increase the number of MOS transistors 21, and furthermore, increase a current required for driving the gates of MOS transistors 21. According to the above-described configuration, it is possible to adjust an amount of a current required for operating the plurality of word line drivers WD by modifying the number of MOS transistors 21 and inverters 23 in accordance with the circuit size.

The second reason is to form a gate oxide film of each of MOS transistors 22A, 22B, which configure inverter 22 in the former stage, such that the gate oxide film has a thickness larger than a thickness of a gate oxide film of each of MOS transistors 23A, 23B, which configure inverter 23 in the latter stage, in accordance with a voltage value of control signal WLPD at an H level.

A voltage value of control signal WLPD at an H level, which is outputted from control circuit 8 in FIG. 1, is equal to external power supply voltage VCC (e.g. 3 V) that drives control circuit 8, and is often higher than internal power supply voltages SVDD, VDD (e.g. 1.5 V). Therefore, to adapt to the voltage value of external power supply voltage VCC, a film thickness of the gate oxide film of each of MOS transistor 22A, 22B that configure inverter 22 is made larger than a film thickness of the gate oxide film of the MOS transistor used in memory cell MC and the like.

It is noted that, in FIG. 2, a gate oxide film of MOS transistor 11, to which control signal WLPD is inputted, is also formed to have a large thickness as in the gate oxide film of each of MOS transistors 22A, 22B that configure inverter 22.

Figure 3:
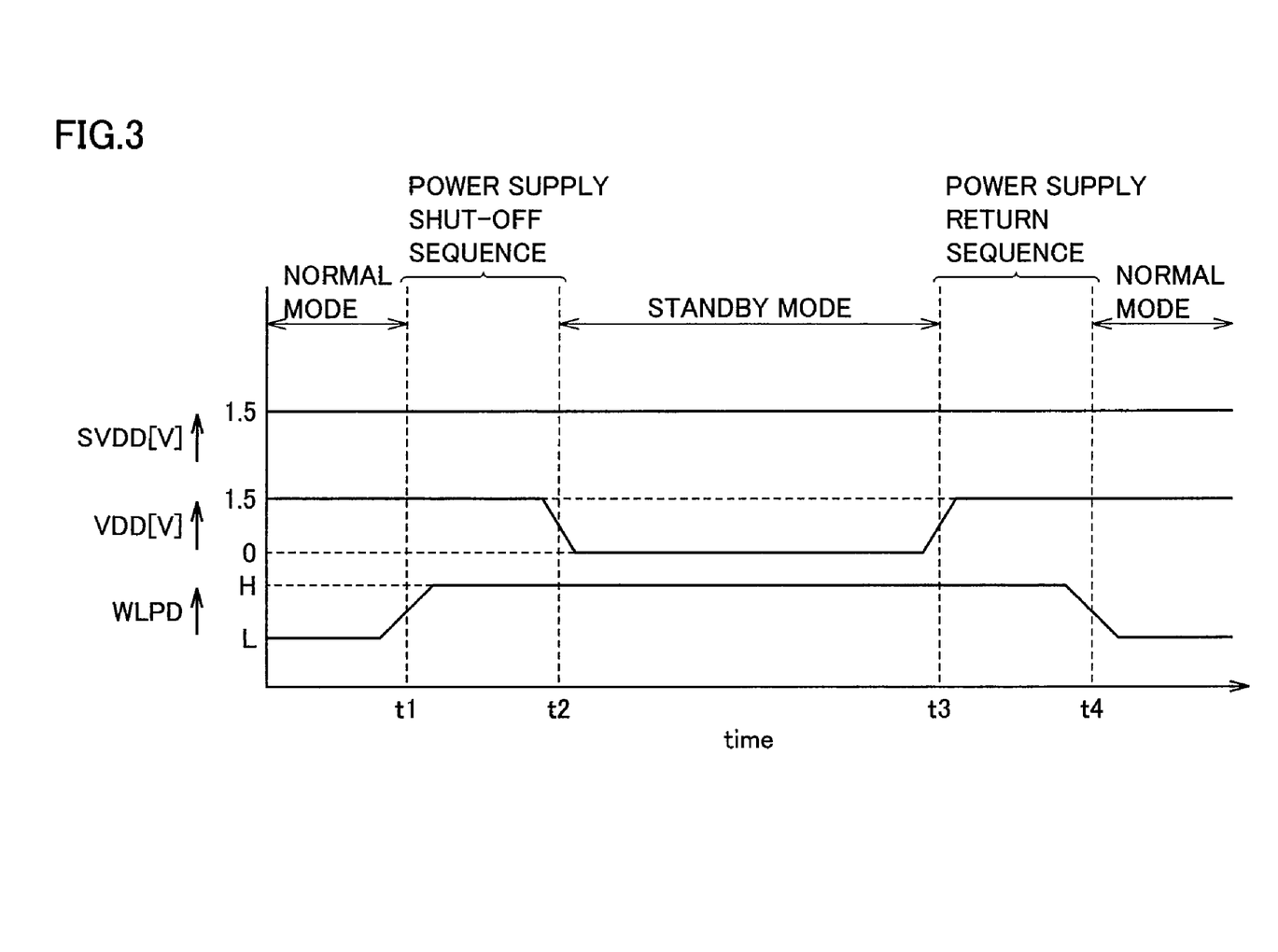
FIG. 3 is timing diagram of internal power supply voltages SVDD, VDD, and a control signal WLPD when an operational mode is shifted.

FIG. 3 is a timing diagram of internal power supply voltages SVDD, VDD, and control signal WLPD when the operational mode is shifted. An axis of ordinates in FIG. 3 indicates logic levels of internal power supply voltage SVDD, internal power supply voltage VDD, and control signal WLPD from the top. An axis of abscissas in FIG. 3 indicates elapsed time. A shut-off sequence of internal power supply voltage VDD is performed between times t1-t2, and a return sequence of internal power supply voltage VDD is performed between times t3-t4.

With reference to FIG. 3, in the normal mode prior to time t1, a voltage of 1.5 V is supplied, as internal power supply voltages SVDD, VDD, to a load circuit of semiconductor device 1. A voltage of control signal WLPD supplied to SRAM 3 is at an L level (inactive level).

In the shut-off sequence in which the operation mode is shifted from the normal mode to the standby mode, control signal WLPD is initially switched to an H level, namely, an active state at time t1. As a result, as described in FIG. 2, MOS transistor 11 in FIG. 2 is brought into a conduction state, and a voltage of word line WL is clamped to an L level (ground voltage VSS), namely, an inactive state. Further, MOS transistor 21 in FIG. 2 is brought into a non-conduction state, and the supply of internal power supply voltage VDD to word line driver WD is shut off.

At the next time t2, the supply of internal power supply voltage VDD is halted, and an output voltage of VDD generation circuit 6 in FIG. 1 falls from 1.5 V to 0 V. At this time, even if a noise is generated owing to the falling edge of the output voltage, power supply line 27 of word line driver WD is preliminarily interrupted, so that the generated noise does not flow to word line WL via word line driver WD.

Next, in the return sequence in which the operational mode is shifted from the standby mode to the normal mode, the supply of internal power supply voltage VDD is initially started at time t3, and an output voltage of VDD generation circuit 6 in FIG. 1 rises from 0 V to 1.5 V. At this time, even if a noise is generated owing to the rising edge of the output voltage, power supply line 27 of word line driver WD is interrupted, so that the generated noise does not flow to word line WL.

At the next time t4, control signal WLPD is switched to an L level, namely, an inactive state. As described in FIG. 2, MOS transistor 11 in FIG. 2 is then brought into a non-conduction state, and the clamped state of word line WL to the inactive level is cancelled. Furthermore, MOS transistor 21 in FIG. 2 is brought into the conduction state, and internal power supply voltage VDD is supplied to word line driver WD. As such, the operational mode of semiconductor device 1 returns to the normal mode.

Figure 4:
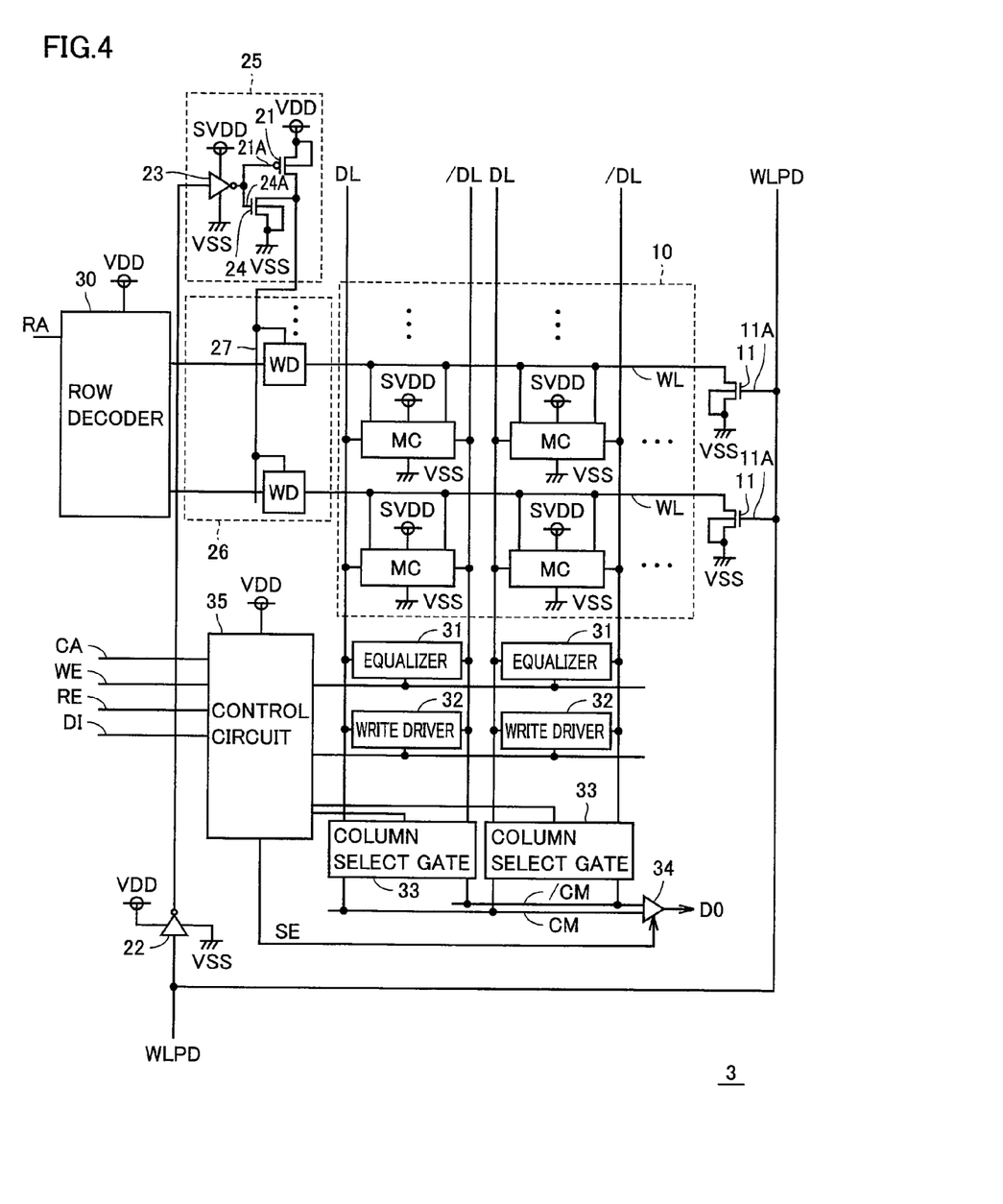
FIG. 4 is a block diagram that shows a configuration of SRAM 3 in the first embodiment.

FIG. 4 is a block diagram that shows a configuration of SRAM 3 in the first embodiment.

Figure 5:
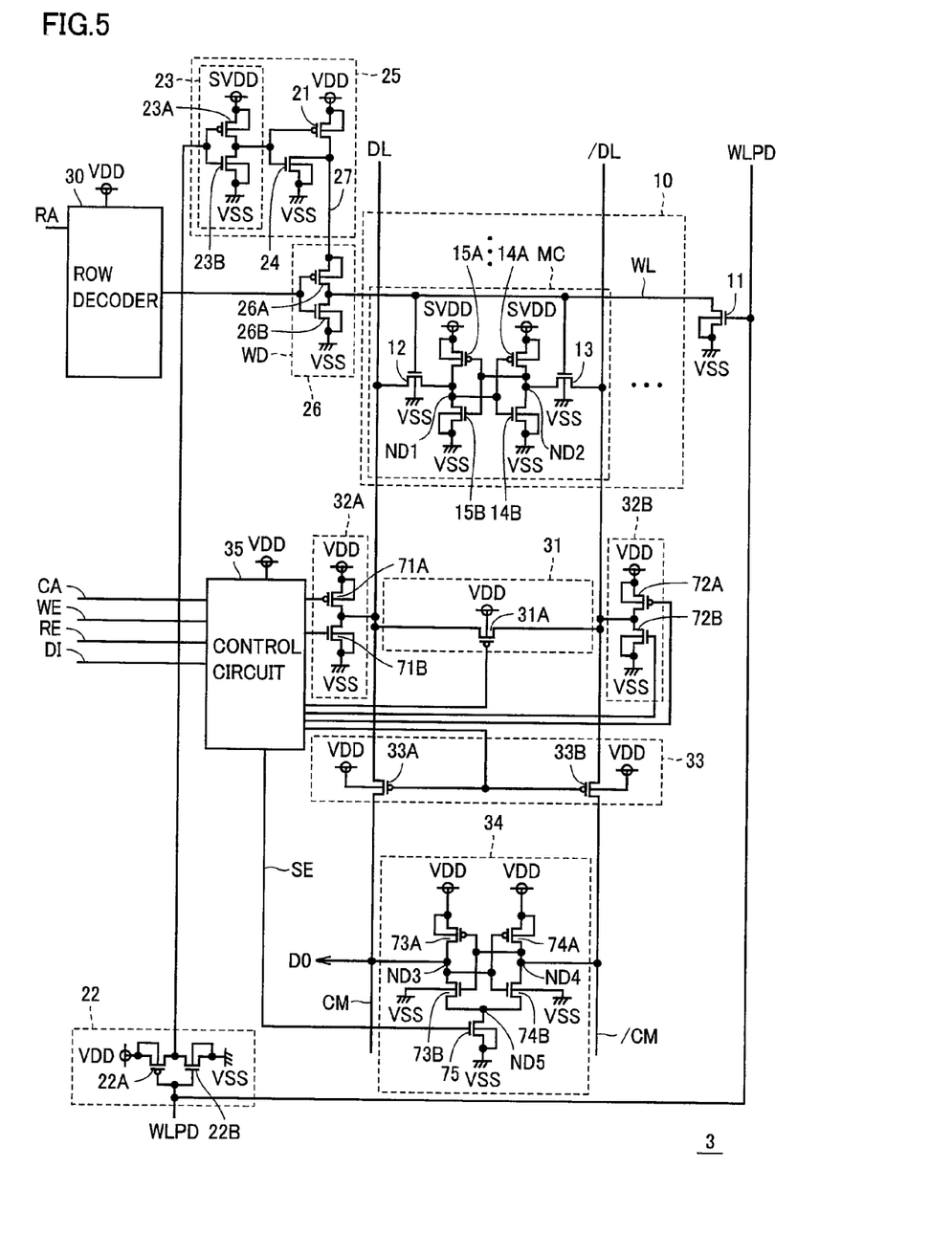
FIG. 5 is a circuit diagram that shows in further detail the configuration of SRAM 3 in FIG. 4.

FIG. 5 is a circuit diagram that shows in further detail the configuration of SRAM 3 in FIG. 4.

With reference to FIG. 4 and FIG. 5, SRAM 3 includes memory cell array 10, a row decoder 30, and a word line driver unit 26.

Memory cell array 10 includes a plurality of memory cells MC arranged in a plurality of rows and a plurality of columns, a plurality of word lines WL provided to correspond to the plurality of rows, respectively, and a plurality of data line pairs DL, /DL provided to correspond to the plurality of columns, respectively. It is noted that, although multiple memory cells MC are actually provided, FIG. 4 shows only four memory cells MC for simplifying the drawing, and FIG. 5 shows only one memory cell MC.

As shown in FIG. 5, memory cell MC includes a P-channel MOS transistor 14A and an N-channel MOS transistor 14B that correspond to inverter 14 in FIG. 2, and a P-channel MOS transistor 15A and an N-channel MOS transistor 15B that correspond to inverter 15 in FIG. 2. A source and a back gate of each of MOS transistors 14A, 15A are connected to power supply node SVDD. A source and a back gate of each of MOS transistors 14B, 15B are connected to ground node VSS. A drain of each of MOS transistors 14A, 14B is connected to storage node ND2, and a drain of each of MOS transistors 15A, 15B is connected to storage node ND1. Further, a gate electrode of each of MOS transistors 14A, 14B is connected to storage node ND1, and a gate electrode of each of MOS transistors 15A, 15B is connected to storage node ND2.

Row decoder 30 is driven by internal power supply voltage VDD, and in the normal operation, selects word line WL in accordance with a row address signal RA. Row decoder 30 outputs a row select signal activated to an L level, to word line driver WD corresponding to the selected word line WL.

As shown in FIG. 4, word line driver unit 26 includes a plurality of word line drivers WD connected to the plurality of rows of word lines WL, respectively. As shown in FIG. 5, each of word line drivers WD includes an inverter configured with a P-channel MOS transistor 26A and an N-channel MOS transistor 26B. A source of MOS transistor 26A is connected to power supply line 27 to which internal power supply voltage VDD is supplied. A source of MOS transistor 26B is connected to ground node VSS. A row select signal is inputted to a gate electrode of each of MOS transistors 26A, 26B from row decoder 30. A drain of each of MOS transistors 26A, 26B is connected to corresponding word line WL.

As described in FIG. 2, SRAM 3 further includes the plurality of MOS transistors 11 provided to correspond to the plurality of word lines WL, respectively, MOS transistor 21 connected to power supply line 27 of word line driver WD, and inverters 22, 23 for driving the gate electrode of MOS transistor 21. Each of N-channel MOS transistors 11, 22B, 23B has a back gate connected to ground node VSS. Internal power supply voltage SVDD is provided to a back gate of P-channel MOS transistor 23A, and internal power supply voltage VDD is provided to a back gate of each of P-channel MOS transistors 21, 22A. Other features are the same as those in FIG. 2, and the description thereof will not be repeated.

SRAM 3 further includes an N-channel MOS transistor 24 connected between the ground node and a position of power supply line 27, which position is closer to the word line driver with respect to MOS transistor 21 (i.e. the drain of MOS transistor 21). An output node of inverter 23 is connected to a gate electrode 24A (control node) of MOS transistor 24. A back gate of MOS transistor 24 is connected to ground node VSS. As a result, when control signal WLPD is activated to an H level in the standby mode, MOS transistor 24 is brought into a conduction state. In other words, MOS transistor 24 functions as a switch for clamping a voltage of power supply line 27 to ground voltage VSS in accordance with control signal WLPD. A voltage of power supply line 27 is clamped to ground voltage VSS as such, so that it is possible to reliably set the output signal of word line driver WD to 0 V in the standby mode.

Here, inverter 23 is driven by internal power supply voltage SVDD as memory cell array 10 is, and hence is arranged at a position closer to memory cell array 10 with respect to inverter 22 driven by internal power supply voltage VDD. In an actual circuit layout, MOS transistors 21, 24, and inverter 23 are arranged closer to one another, for serving as a power supply circuit unit 25 for the word line driver.

SRAM 3 further includes: a control circuit 35; an equalizer 31, a write driver 32, and a column select gate 33, each of which is provided to correspond to each data line pair DL, /DL; and a common line pair CM, /CM and a sense amplifier 34, each of which is commonly provided to the plurality of data line pairs DL, /DL.

Control circuit 35 is driven by internal power supply voltage VDD, and controls equalizer 31, write driver 32, column select gate 33, and sense amplifier 34 in accordance with a column address signal CA, a write data signal DI, a write control signal WE, and a read control signal RE.

As shown in FIG. 5, equalizer 31 includes a P-channel MOS transistor 31A controlled by control circuit 35. P-channel MOS transistor 31A is connected between corresponding data lines DL, /DL, and its back gate receives internal power supply voltage VDD. When P-channel MOS transistor 31A is brought into conduction, data lines DL, /DL are connected, and voltages of data lines DL, /DL are equalized.

Write driver 32 (32A, 32B in FIG. 5) includes P-channel MOS transistors 71A, 72A and N-channel MOS transistors 71B, 72B controlled by control circuit 35. P-channel MOS transistors 71A, 72A have sources both receiving internal power supply voltage VDD, have drains connected to corresponding data lines DL, /DL, respectively, and have back gates both receiving internal power supply voltage VDD. N-channel MOS transistors 71B, 72B have sources both receiving ground voltage VSS, have drains connected to corresponding data lines DL, /DL, respectively, and have back gates both receiving ground voltage VSS.

When transistors 71A, 72B are brought into conduction while word line WL is activated, data at an H level (internal power supply voltage VDD) and data at an L level (ground voltage VSS) are written to storage nodes ND1, ND2 via data lines DL, /DL, respectively. When transistors 71B, 72A are brought into conduction while word line WL is activated, data at an L level (ground voltage VSS) and data at an H level (internal power supply voltage VDD) are written to storage nodes ND1, ND2 via data lines DL, /DL, respectively.

Column select gate 33 includes P-channel MOS transistors 33A, 33B controlled by control circuit 35. P-channel MOS transistor 33A is connected between corresponding data line DL and common line CM, has a back gate receiving internal power supply voltage VDD, and has a gate connected to control circuit 35. P-channel MOS transistor 33B is connected between corresponding data line /DL and common line /CM, has a back gate receiving internal power supply voltage VDD, and has a gate connected to the gate of P-channel MOS transistor 33A. When P-channel MOS transistors 33A, 33B are brought into conduction, voltages of data lines DL, /DL are transmitted to common lines CM, /CM, respectively.

Sense amplifier 34 includes P-channel MOS transistors 73A, 74A and N-channel MOS transistors 73B, 74B, 75. P-channel MOS transistors 73A, 74A have sources both receiving internal power supply voltage VDD, have drains connected to input/output (I/O) nodes ND3, ND4, respectively, and have gates connected to I/O nodes ND4, ND3, respectively.

N-channel MOS transistors 73B, 74B have sources both connected to a node ND5, have drains connected to I/O nodes ND3, ND4, respectively, and have gates connected to I/O nodes ND4, ND3, respectively. N-channel MOS transistor 75 is connected between node ND5 and ground node VSS, and has a gate receiving a control signal SE outputted from control circuit 35. I/O nodes ND3, ND4 are connected to common lines CM, /CM, respectively.

When control signal SE is at a non-activated level, namely, an L level (ground voltage VSS), N-channel MOS transistor 75 is brought into non-conduction, and sense amplifier 34 is deactivated. When control signal SE becomes an activated level, namely, an H level (internal power supply voltage VDD), N-channel MOS transistor 75 is brought into conduction, and sense amplifier 34 is activated.

Next, read and write operations of the SRAM will be described briefly.

A write operation is performed when control signal WE becomes an activated level. Row decoder 30 transmits a row select signal according to row address signal RA to word line driver WD, and the selected word line is activated to an H level. Access transistors 12, 13 in each memory cell MC corresponding to the selected word line WL are thereby brought into conduction.

When write data signal DI is at an H level, for example, control circuit 35 brings transistors 71A, 72B, out of transistors 71A, 71B, 72A, 72B corresponding to the column specified by column address signal CA, into conduction, and sets data lines DL, /DL to an H level and an L level, respectively. In contrast, when write data signal DI is at an L level, control circuit 35 brings transistors 71B, 72A, out of transistors 71A, 71B, 72A, 72B, into conduction, and sets data lines DL, /DL to an L level and an H level, respectively. Data signal DI is thereby written to memory cell MC specified by address signals RA, CA.

A read operation is performed when read control signal RE becomes an activated level. Control circuit 35 brings transistors 71A, 72A in all the columns into conduction to precharge data lines DL, /DL to internal power supply voltage VDD, and brings transistor 31A into conduction to equalize voltages of data lines DL, /DL. Row decoder 30 transmits a row select signal according to row address signal RA to word line driver WD, and the selected word line WL is activated to an H level. The voltages of data lines DL, /DL configuring a data line pair vary in accordance with the data stored in each memory cell MC connected to the selected word line.

Control circuit 35 brings into conduction transistors 33A, 33B in a column specified by column address signal CA, transmits voltages of data lines DL, /DL in that column to common lines CM, /CM, respectively, and furthermore, sets control signal SE to an activated level, namely, an H level, to activate sense amplifier 34. A voltage between data line pair DL, /DL is thereby amplified by sense amplifier 34, and a voltage of data line DL is outputted as a read data signal DO.

Figure 6:
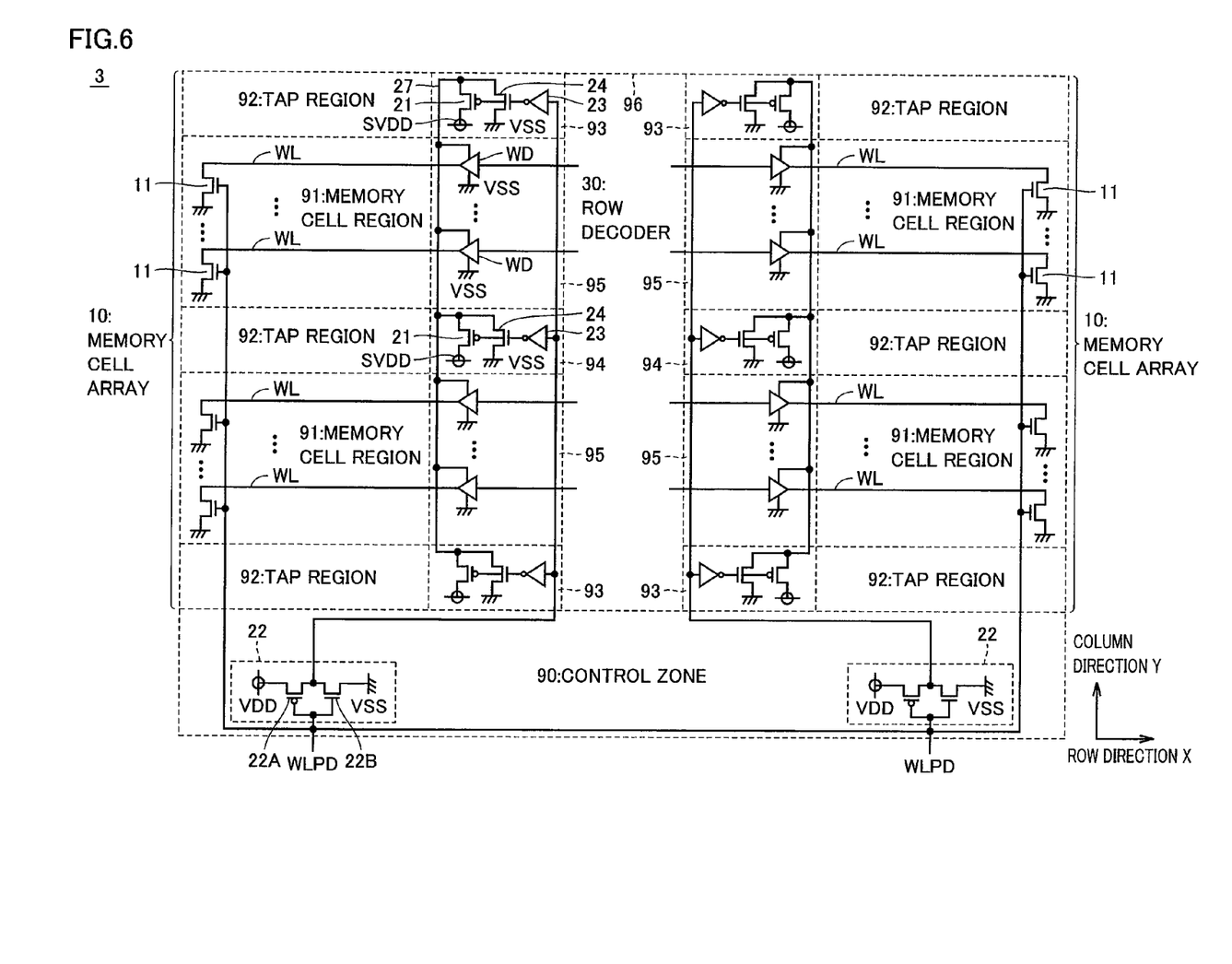
FIG. 6 is a plan view that shows an exemplary circuit layout of SRAM 3 on a semiconductor substrate.

FIG. 6 is a plan view that shows an exemplary circuit layout of SRAM 3 on a semiconductor substrate. A row direction X of memory cell array 10 corresponds to a right-left direction in FIG. 6, while a column direction Y of memory cell array 10 corresponds to a top-bottom direction in FIG. 6.

With reference to FIG. 6, a region on the semiconductor substrate, where SRAM 3 is arranged, is divided into a plurality of regions. When the regions are roughly classified along column direction Y, a control zone 90 is arranged on one side of column direction Y (on the lower side of FIG. 6). Control zone 90 is provided with equalizer 31, write driver 32, column select gate 33, sense amplifier 34, control circuit 35, inverter 22, and the like in FIG. 4.

On the other side of column direction Y (on the upper side of FIG. 6), there are provided regions 91-96 where memory cell array 10, row decoder 30, word line driver unit 26, and the like are provided. Among regions 91-96, region 96 located at the center in row direction X is provided with row decoder 30. Regions 93-95 located outward with respect to row decoder 30 along row direction X are provided with word line driver WD and power supply circuit unit 25 (MOS transistors 21, 24, and inverter 23). Regions 91, 92 located further outward are provided with memory cell array 10.

How to arrange word line driver WD, power supply circuit unit 25, and memory cell array 10 will now be described in further detail. The region where these are arranged can be divided into a first region (memory cell region) 91, a second region (TAP region) 92, a third region 95, and fourth regions 93, 94. As shown in FIG. 6, each first region 91 and each second region 92 are alternately arranged along column direction Y. Each third region 95 and each of fourth regions 93, 94 are alternately arranged along column direction Y. Each first region 91 is adjacent to one of third regions 95 in row direction X. Each second region 92 is adjacent to one of fourth regions 93, 94 in row direction X.

In first regions (memory cell region) 91, memory cell array 10 is arranged in such a manner as to be divided into a plurality of sections, the plurality of sections being arranged in first regions, respectively. In each second region (TAP region) 92, there are provided a plurality of well taps (well contacts) for clamping a potential of each of a plurality of wells formed at the semiconductor substrate. In each third region 95, there is arranged word line driver WD that corresponds to word line WL provided in adjacent first region 91. In each of fourth regions 93, 94, power supply circuit unit 25 (MOS transistors 21, 24, and inverter 23) is provided.

The reason why second region (TAP region) 92 is provided is that it is necessary to provide a well tap for a prescribed number of memory cell rows to uniformize potentials in the wells, in consideration of resistance of the wells. In this case, there is no need to provide word line driver WD in fourth regions 93, 94 adjacent to well tap region 92 in row direction X. Therefore, these regions 93, 94 are effectively utilized to allow power supply circuit unit 25 (inverter 23 and MOS transistors 21, 24) in FIG. 4 and FIG. 5 to be arranged. As such, it is possible to provide power supply circuit unit 25 with almost no increase in circuit area of the entire SRAM 3.

Here, to suppress increase in circuit area, the size of MOS transistors 23A, 23B, 21, 24 provided in fourth regions 93, 94 is restricted by a width of second region (TAP region) 92 in column direction Y. However, the number of second regions (TAP region) 92 increases as the number of memory cell rows increases, and hence the number of fourth regions 94 also increases. As a result, the number of MOS transistors 23A, 23B, 21, 24 can also be increased, and hence it is possible to ensure an amount of a current required for driving word line driver WD, in accordance with the circuit size.

It is noted that fourth regions 93 located at opposite ends in column direction Y have spare room. Therefore, it is possible to allow MOS transistors 21, 24, 23A, 23B provided in region 93 to have a size larger than a size of MOS transistors 21, 24, 23A, 23B provided in fourth region 94 interposed between third regions 95, to further increase an amount of a current to be supplied to word line driver WD.

Figure 7:
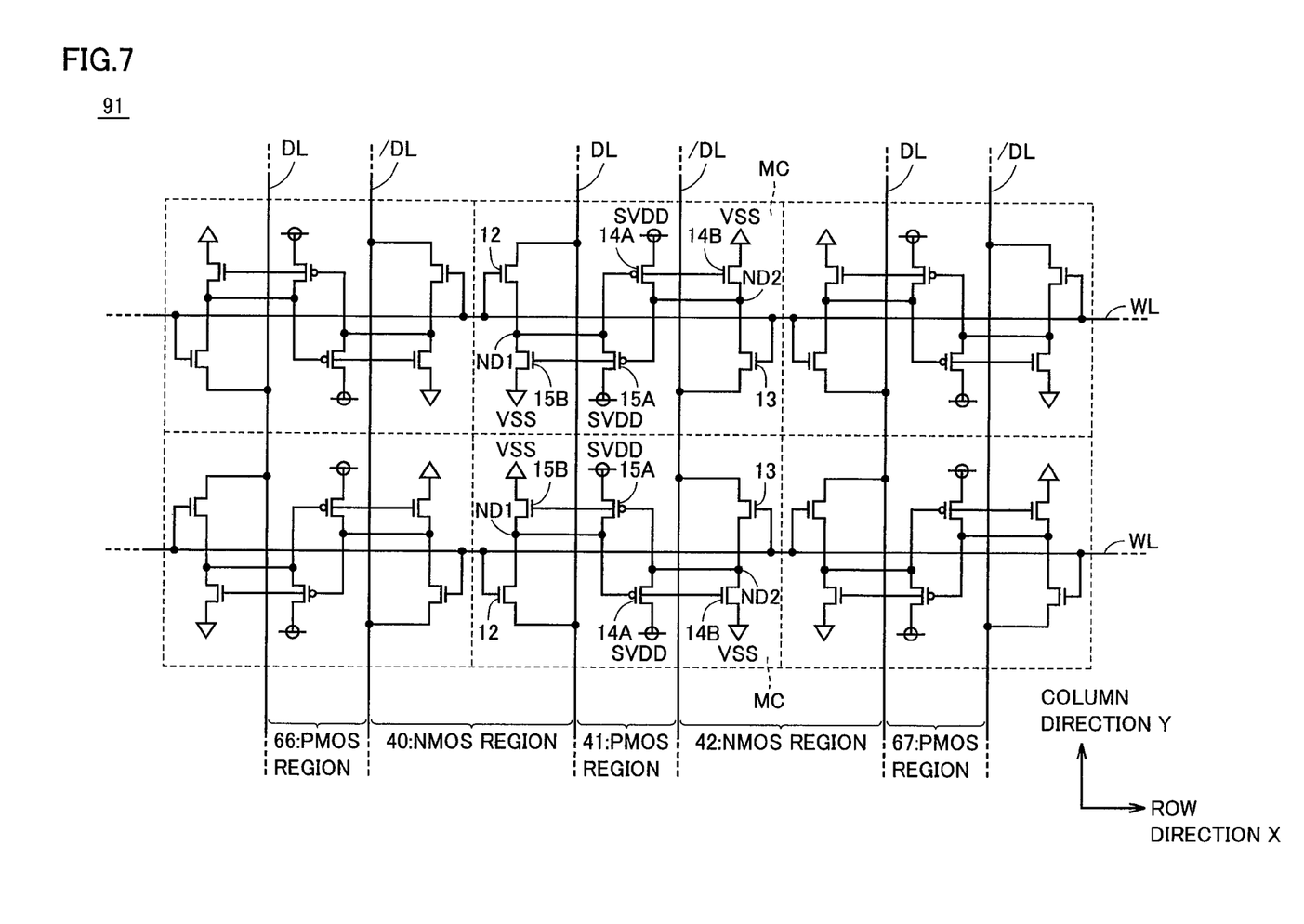
FIG. 7 is a circuit diagram that schematically shows an exemplary layout of memory cells MC on the semiconductor substrate.

FIG. 7 is a circuit diagram that schematically shows an exemplary layout of memory cells MC on a semiconductor substrate. In FIG. 7, a region surrounded by a rectangular drawn by dotted lines corresponds to one memory cell MC.

With reference to FIG. 7, P-channel MOS transistors 14A, 15A that configure each memory cell MC are arranged along column direction Y. Further, N-channel MOS transistors 12, 15B are arranged along column direction Y, and N-channel MOS transistors 13, 14B are arranged along column direction Y. As a result, PMOS regions 41, 67, 66, and NMOS regions 40, 42 are alternately arranged in row direction X.

Figure 8:
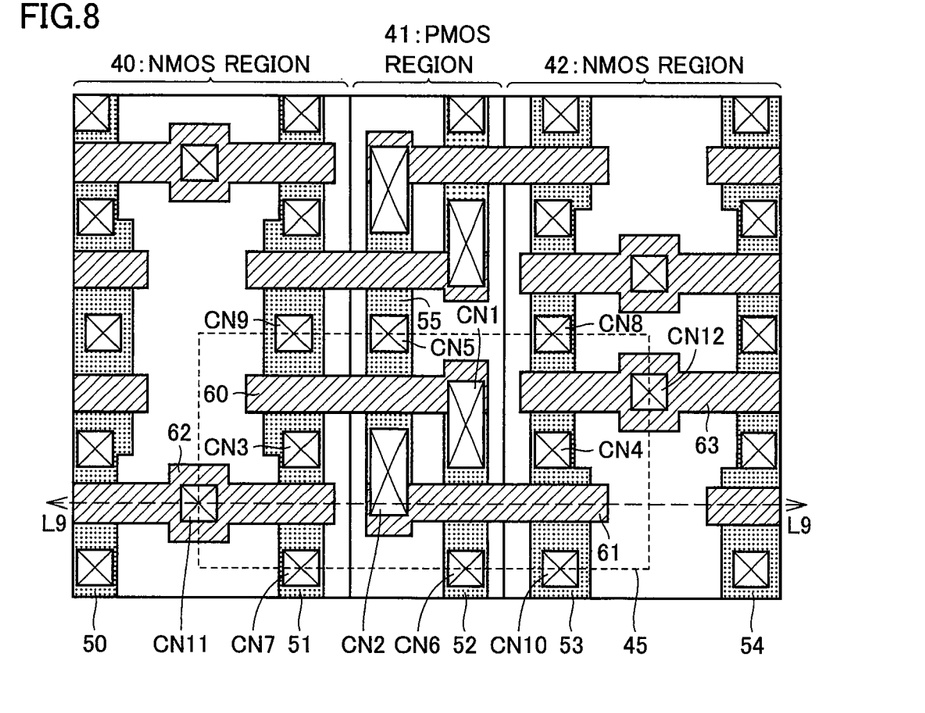
FIG. 8 is a plan view that schematically shows an exemplary layout of memory cells MC on the semiconductor substrate.

FIG. 8 is a plan view that schematically shows an exemplary layout of memory cells MC on a semiconductor substrate.

With reference to FIG. 8, NMOS regions 40, 42 each for forming N-channel MOS transistors are arranged on opposite sides of PMOS region 41 for forming P-channel MOS transistors. Each of MOS regions 40-42 is disposed in a linearly and continuously-extending manner in the column direction. In MOS regions 40-42, memory cells MC are formed in such a manner as to be aligned in a line.

In PMOS region 41, active regions 52, 55 each for forming P-channel MOS transistors are formed in a rectangular shape. Active regions 52, 55 are shared by memory cells MC that are adjacent in the column direction.

In NMOS region 40, N-type active regions 50, 51 each for forming N-channel MOS transistors are formed in a linearly-extending manner. Further, in NMOS region 42, N-type active regions 53, 54 each for forming N-channel MOS transistors are formed in a linearly-extending manner in the column direction and spaced apart from each other. In FIG. 8, a region of memory cell MC corresponding to one bit is shown by a rectangular region 45 drawn by dotted lines.

In 1-bit memory cell MC region 45, a gate electrode 60 is arranged to extend in the row direction such that it crosses active regions 51, 55, and is connected to active region 52 via a contact CN1. Gate electrode 60 and active region 51 form MOS transistor 15B in FIG. 7, and gate electrode 60 and active region 55 form MOS transistor 15A in FIG. 7. Similarly, gate electrode 61 is arranged at a position point-symmetric to gate electrode 60, to extend in the row direction such that it crosses active regions 52, 53, and is connected to active region 55 via a contact CN2. Gate electrode 61 and active region 52 form MOS transistor 14A in FIG. 7, and gate electrode 61 and active region 53 form MOS transistor 14B in FIG. 7.

Contact CN2 and a contact CN3 provided in active region 51 are connected by a metal interconnection layer which is located in an upper layer and extends in the row direction, to thereby form storage node ND1. Further, contact CN1 and a contact CN4 provided in active region 53 are connected by a metal interconnection layer which is located in an upper layer and extends in the row direction, to thereby form storage node ND2.

A contact CN5 is provided at a portion of active region 55, which portion is opposed to contact CN2 with gate electrode 60 interposed therebetween. Contact CN5 is connected to a line for supplying internal power supply voltage SVDD, located in an upper layer. Similarly, a contact CN6 is provided at a portion of active region 52, which portion is opposed to contact CN1 with gate electrode 61 interposed therebetween. Contact CN6 is connected to a line for supplying internal power supply voltage SVDD, located in an upper layer.

Further, a contact CN9 is provided at a portion of active region 51, which portion is opposed to contact CN3 with gate electrode 60 interposed therebetween. Contact CN9 is connected to a line of ground voltage VSS, located in an upper layer. Similarly, a contact CN10 is provided at a portion of active region 53, which portion is opposed to contact CN4 with gate electrode 61 interposed therebetween. Contact CN10 is connected to a line of ground voltage VSS, located in an upper layer.

Gate electrode 62 is formed to cross active region 51, at a position opposed to gate electrode 60 with contact CN3 interposed therebetween. Further, gate electrode 63 is formed to cross active region 53, at a position opposed to gate electrode 61 with contact CN4 interposed therebetween. Gate electrodes 62, 63 are connected to word lines in an upper layer via contacts CN11, CN12, respectively, and configure the gates of access transistors 12, 13 in FIG. 7, respectively. Each of gate electrodes 62, 63 is shared by memory cells MC adjacent in the row direction.

A contact CN7 is provided at a portion of active region 51, which portion is opposed to contact CN3 with gate electrode 62 interposed therebetween. Contact CN7 is connected to data line DL which is located in an upper layer and extends in the column direction. Similarly, a contact CN8 is provided at a portion of active region 53, which portion is opposed to contact CN4 with gate electrode 63 interposed therebetween. Contact CN8 is connected to data line /DL which is located in an upper layer and extends in the column direction.

A layout of one-bit memory cell MC region 45 is repeatedly disposed in a manner mirror-symmetric in the row direction and in the column direction. At this time, by allowing NMOS regions 40, 42 and PMOS region 41 to extend linearly in the column direction, it is possible to control a well potential of each of NMOS regions 40, 42, and PMOS region 41 on a column-by-column basis. Therefore, well tap region 92 is provided to extend in the row direction as shown in FIG. 6.

Figure 9:
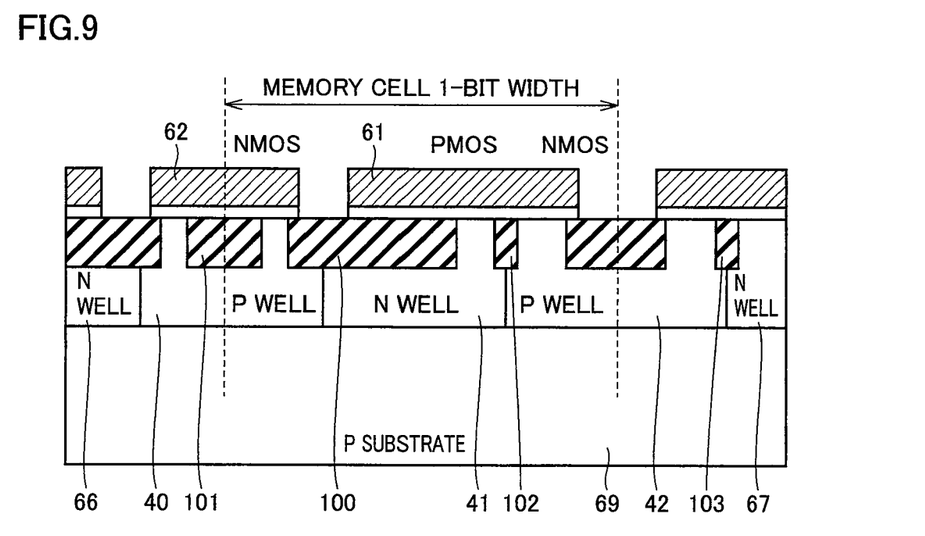
FIG. 9 is a diagram that schematically shows a cross-sectional structure taken along a line L9-L9 shown in FIG. 8.

FIG. 9 is a diagram that schematically shows a cross-sectional structure taken along a line L9-L9 shown in FIG. 8. In FIG. 9, memory cell MC is formed on a P-type (silicon) substrate 69. NMOS region 40 is defined by a P well, PMOS region 41 is defined by an N well, and NMOS region 42 is defined by a P well. The well regions corresponding to these MOS regions are shown by the same reference characters. N wells 66, 67, each of which is for forming a P-channel MOS transistor of an adjacent memory cell MC, are formed outside P well 40 and P well 42, respectively.

Trench regions 100-103 are formed in wells 40-42, 66, 67 for isolating elements. Each of trench regions 100-103 is a shallow trench isolation (STI) region, and is formed by filling a trench region, which is formed at a well surface, with an insulating film. Each of active regions 50-54 is an impurity region. FIG. 9 shows a cross-sectional structure taken along gate electrode 61 shown in FIG. 8, and a channel region is formed therein. Therefore, FIG. 9 does not show an impurity region that forms these active regions.

Gate electrode 61 is arranged to extend on both of N well 41 and P well 42, and gate electrode 62 is formed on P well 40 to cover trench region 101. Therefore, to isolate this transistor, an STI film is used. Active regions 50-54 are isolated by an STI region.

Second Embodiment

In a second embodiment, there is shown a method of preventing erroneous write of data in the standby mode, by utilizing control signal WLPD outputted from control circuit 8 in FIG. 1, and by using means different from the means in the first embodiment. The method in the second embodiment may be implemented in combination with the first embodiment, or may be implemented independently of the first embodiment.

Figure 10:
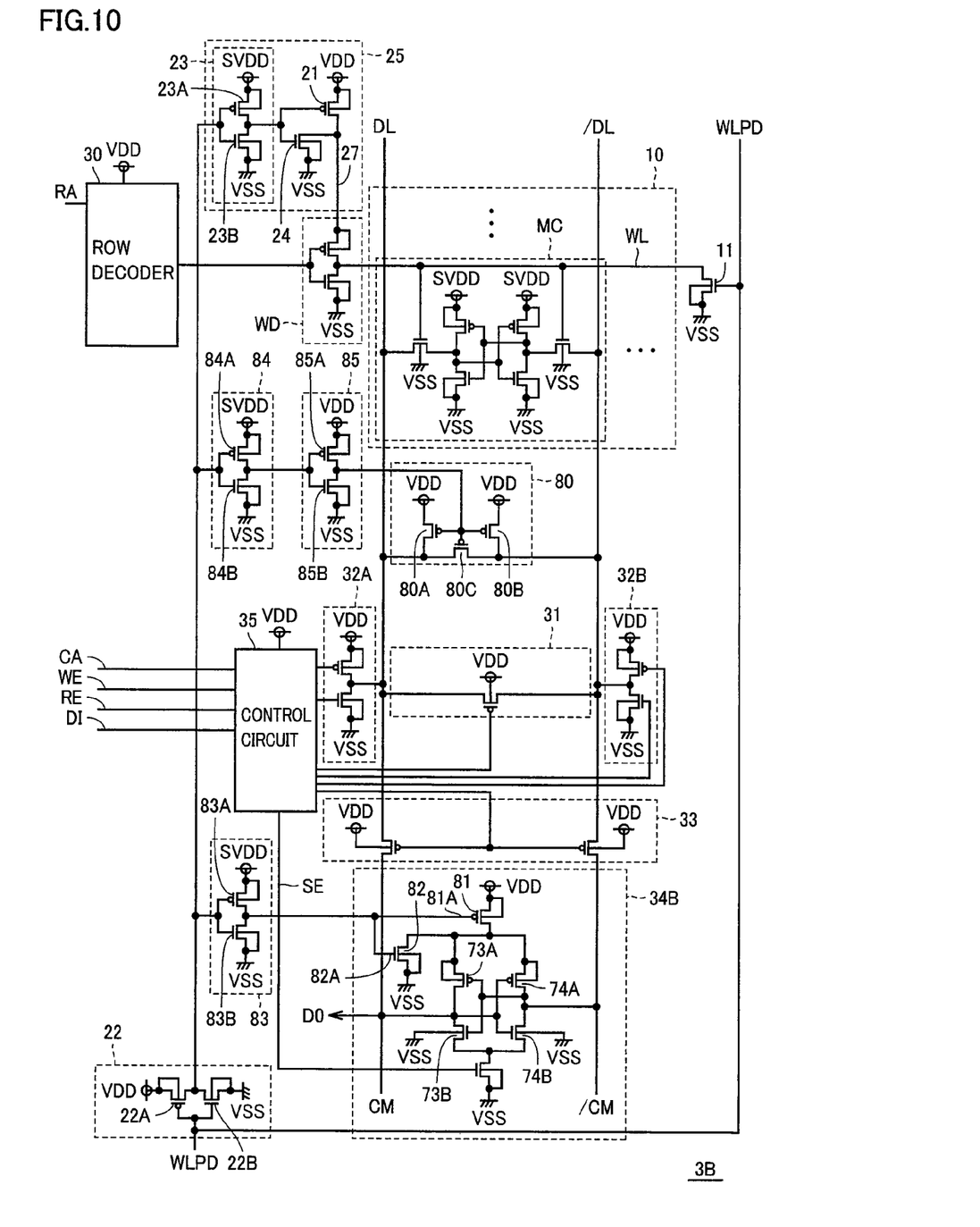
FIG. 10 is a circuit diagram that shows a configuration of an SRAM 3B in a second embodiment of the present invention.

FIG. 10 is a circuit diagram that shows a configuration of an SRAM 3B in the second embodiment of the present invention.

With reference to FIG. 10, SRAM 3B in the second embodiment differs from SRAM 3 in the first embodiment shown in FIG. 5 in that it further includes a voltage-setting circuit 80 for setting voltages of data line pair DL, /DL to internal power supply voltage VDD, and CMOS inverters 84, 85.

Voltage-setting circuit 80 includes P-channel MOS transistors 80A, 80B, 80C. Among them, MOS transistors 80A, 80B have sources and back gates to which internal power supply voltage VDD is supplied. MOS transistors 80A, 80B have drains connected to data lines DL, /DL, respectively. MOS transistor 80C is connected between data line DL, /DL. MOS transistor 80C has a back gate to which internal power supply voltage VDD is supplied.

In SRAM 3B in the second embodiment, control signal WLPD is supplied to the gate electrodes of MOS transistors 80A, 80B, 80C via inverters 22, 84, 85. As described in the first embodiment, inverter 22 includes P-channel MOS transistor 22A and N-channel MOS transistor 22B connected in series between power supply node VDD and ground node VSS. Control signal WLPD is inputted to the gate electrodes of MOS transistors 22A, 22B.

Inverter 84 includes a P-channel MOS transistor 84A and an N-channel MOS transistor 84B connected in series between power supply node SVDD and ground node VSS. The drains of MOS transistors 22A, 22B, namely, an output node of inverter 22, is connected to the gate electrodes of MOS transistors 84A, 84B. Internal power supply voltage SVDD is supplied to the back gate of MOS transistor 84A, and ground voltage VSS is supplied to the back gate of MOS transistor 84B.

Inverter 85 includes a P-channel MOS transistor 85A and an N-channel MOS transistor 85B connected in series between power supply node VDD and ground node VSS. Internal power supply voltage VDD is supplied to the back gate of MOS transistor 85A, and ground voltage VSS is supplied to the back gate of MOS transistor 85B. The drains of MOS transistors 84A, 84B, namely, an output node of inverter 84, is connected to the gate electrodes of MOS transistors 85A, 85B. The drains of MOS transistors 85A, 85B are connected to the gate electrodes of MOS transistors 80A, 80B, 80C.

According to the above-described configuration, if control signal WLPD is activated to an H level when the operational mode is shifted from the normal mode to the standby mode, MOS transistors 22B, 84A, 85B that configure inverters 22, 84, 85, respectively, are brought into a conduction state. A signal at an L level (ground voltage VSS) is thereby inputted to the gate electrode of each of MOS transistors 80A, 80B, 80C, and hence MOS transistors 80A, 80B, 80C are brought into a conduction state. As a result, both of data lines DL, /DL are charged to internal power supply voltage VDD. As such, the supply of internal power supply voltage VDD is halted in the state where data line pair DL, /DL is preliminarily charged to internal power supply voltage VDD. Therefore, even if a noise is generated owing to a falling edge of an output voltage of VDD generation circuit 6 in FIG. 1, it is possible to prevent erroneous write of data to memory cell MC.

Further, sense amplifier 34B in the second embodiment differs from sense amplifier 34 in the first embodiment shown in FIG. 5 in that it further includes P-channel MOS transistor 81, N-channel MOS transistor 82, and a CMOS inverter 83 for driving the gate electrodes of MOS transistors 81, 82.

MOS transistor 81 is connected between power supply node VDD and the sources of MOS transistors 73A, 74A. Internal power supply voltage VDD is supplied to the back gate of MOS transistor 81. Further, MOS transistor 82 is connected between ground node VSS and the sources of MOS transistors 73A, 74A. Ground voltage VSS is supplied to the back gate of MOS transistor 82.

Inverter 83 includes a P-channel MOS transistor 83A and an N-channel MOS transistor 83B connected in series between power supply node SVDD and ground node VSS. The drains of MOS transistors 22A, 22B, namely, an output node of inverter 22, is connected to the gate electrodes of MOS transistors 83A, 83B. Internal power supply voltage SVDD is supplied to the back gate of MOS transistor 83A, and ground voltage VSS is supplied to the back gate of MOS transistor 83B. The drains of MOS transistors 83A, 83B are connected to the gate electrodes of MOS transistors 81, 82.

In the above-described configuration, when control signal WLPD is activated to an H level in the standby mode, MOS transistors 22B, 83A, which configure inverters 22, 83, respectively, are brought into a conduction state. A signal at an H level (internal power supply voltage SVDD) is then inputted to the gate electrodes of MOS transistors 81, 82, and hence MOS transistor 81 is brought into a non-conduction state, and MOS transistor 82 is brought into a conduction state. As a result, internal power supply voltage VDD supplied to the sources of MOS transistors 73A, 74A, which configure sense amplifier 34B, is shut off. Further, the voltages at the sources of MOS transistors 73A, 74A are clamped to ground voltage VSS via MOS transistor 82. Therefore, by activating control signal WLPD to an H level before halting the supply of internal power supply voltage VDD, when the operational mode is shifted to the standby mode, and by deactivating control signal WLPD to an L level after starting the supply of internal power supply voltage VDD, when the operational mode is shifted to the normal mode, it is possible to prevent malfunction of the sense amplifier, which is caused by a noise generated by switching of the operational mode.

It is noted that other configurations of SRAM 3B are the same as those of SRAM 3 in the first embodiment shown in FIG. 5, and hence the common portions are provided with the same reference characters and the description thereof will not be repeated.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device including a normal mode and a standby mode as an operational mode, the semiconductor device comprising:
    a power supply unit generating a first internal power supply voltage and a second internal power supply voltage;
    a memory cell array including
        a plurality of memory cells provided in rows and columns and driven by said first internal power supply voltage, and
        a plurality of word lines provided to correspond to the rows of said plurality of memory cells, respectively;
    a plurality of word line drivers provided to correspond to said plurality of word lines, respectively, and each driven by said second internal power supply voltage for bringing a corresponding one of the word lines into an active state;
    a plurality of first switches provided to correspond to said plurality of word lines, respectively, and each connected between a corresponding one of the word lines and a reference node providing a reference voltage;
    a second switch provided at a power supply line serving for supplying said second internal power supply voltage to said plurality of word line drivers; and
    a control circuit, wherein
    when said operational mode is switched from said normal mode to said standby mode, said control circuit brings said plurality of first switches into a conduction state and brings said second switch into a non-conduction state, and subsequently halts supply of said second internal power supply voltage, and
    when said operational mode is switched from said standby mode to said normal mode, said control circuit starts the supply of said second internal power supply voltage, and subsequently brings said plurality of first switches into the non-conduction state and brings said second switch into the conduction state.

2. The semiconductor device according to claim 1, wherein said control circuit outputs a signal at a first logic level corresponding to said reference voltage, in said normal mode, and outputs a signal at a second logic level which is an inversion of said first logic level, in said standby mode,
    said semiconductor device further comprises
        a first inverter driven by said second internal power supply voltage, receiving an output signal of said control circuit, and outputting said received output signal of said control circuit with its logic level inverted, and
        a second inverter driven by said first internal power supply voltage, receiving an output signal of said first inverter, and outputting said received output signal of said first inverter with its logic level inverted, and
    said second switch is switched to one of the conduction state and the non-conduction state, in accordance with an output signal of said second inverter.

3. The semiconductor device according to claim 2, wherein each of said first inverter and said second inverter is a CMOS inverter.

4. The semiconductor device according to claim 2, wherein
    a plurality of said second switches and a plurality of said second inverters are provided,
    a region on a semiconductor substrate, in which region said semiconductor device is formed, includes a plurality of first regions, a plurality of second regions, a plurality of third regions, and a plurality of fourth regions,
    each of said plurality of first regions and each of said plurality of second regions are alternately arranged along a column direction of said plurality of memory cells,
    each of said plurality of third regions and each of said plurality of fourth regions are alternately arranged along said column direction,
    each of said plurality of first regions is adjacent to one of said plurality of third regions in a row direction of said plurality of memory cells,
    each of said plurality of second regions is adjacent to one of said plurality of fourth regions in said row direction,
    said memory cell array is arranged in said plurality of first regions in such a manner as to be divided into a plurality of sections, said plurality of sections being arranged in said plurality of first regions, respectively,
    each of said plurality of second regions is provided with a plurality of well taps for clamping a potential of each of a plurality of wells formed at said semiconductor substrate,
    in each of said plurality of third regions, one of the word line drivers corresponding to one of the word lines provided in an adjacent one of the first regions is arranged, and
    at least one of the plurality of said second switches and at least one of the plurality of said second inverters are arranged in each of said plurality of fourth regions.

5. The semiconductor device according to claim 1, wherein
    said semiconductor device further comprises a third switch connected between said reference node and a position of said power supply line, the position being closer to said plurality of word line drivers with respect to said second switch,
    when said operational mode is switched from said normal mode to said standby mode, said control circuit brings said third switch into the conduction state, and subsequently halts the supply of said second internal power supply voltage, and
    when said operational mode is switched from said standby mode to said normal mode, said control circuit starts the supply of said second internal power supply voltage, and subsequently brings said third switch into the non-conduction state.

6. The semiconductor device according to claim 5, wherein said control circuit outputs a signal at a first logic level corresponding to said reference voltage, in said normal mode, and outputs a signal at a second logic level which is an inversion of said first logic level, in said standby mode, said semiconductor device further comprises
- a first inverter driven by said second internal power supply voltage, receiving an output signal of said control circuit, and outputting said received output signal of said control circuit with its logic level inverted, and
- a second inverter driven by said first internal power supply voltage, receiving an output signal of said first inverter, and outputting said received output signal of said first inverter with its logic level inverted, and each of said second switch and said third switch is switched to one of the conduction state and the non-conduction state, in accordance with an output signal of said second inverter.

7. The semiconductor device according to claim 6, wherein each of said first inverter and said second inverter is a CMOS inverter.

8. The semiconductor device according to claim 1, wherein said memory cell array further includes a plurality of data line pairs provided to correspond to the columns of said plurality of memory cells, respectively, said semiconductor device further comprises a plurality of voltage-setting circuits provided to correspond to said plurality of data line pairs, respectively, and each setting a voltage of a corresponding one of the data line pairs to said second internal power supply voltage in accordance with a command from said control circuit, and when said operational mode is switched from said normal mode to said standby mode, said control circuit sets a voltage of each of said plurality of data line pairs to be equal to said second internal power supply voltage by using said plurality of voltage-setting circuits, and subsequently halts the supply of said second internal power supply voltage.

9. The semiconductor device according to claim 1, wherein said memory cell array further includes a plurality of data line pairs provided to correspond to the columns of said plurality of memory cells, respectively, said semiconductor device further comprises
- a sense amplifier driven by said second internal power supply voltage, and connected to each of said plurality of data line pairs, and
- a fourth switch connected to said sense amplifier, and shutting off the supply of said second internal power supply voltage to said sense amplifier in accordance with a command from said control circuit, when said operational mode is switched from said normal mode to said standby mode, said control circuit brings said fourth switch into the non-conduction state, and subsequently halts the supply of said second internal power supply voltage, and when said operational mode is switched from said standby mode to said normal mode, said control circuit starts the supply of said second internal power supply voltage, and subsequently brings said fourth switch into the conduction state.

10. The semiconductor device according to claim 9, wherein
said semiconductor device further comprises a fifth switch connected between said reference node and a connection node of said fourth switch and said sense amplifier, when said operational mode is switched from said normal mode to said standby mode, said control circuit brings said fifth switch into the conduction state, and subsequently halts the supply of said second internal power supply voltage, and when said operational mode is switched from said standby mode to said normal mode, said control circuit starts the supply of said second internal power supply voltage, and subsequently brings said fifth switch into the non-conduction state.

* * * * *